(12) United States Patent
Chen

(10) Patent No.: US 10,950,528 B2
(45) Date of Patent: Mar. 16, 2021

(54) CHIP PACKAGE ASSEMBLY AND METHOD FOR MANUFACTURING THE SAME

(71) Applicant: SILERGY SEMICONDUCTOR TECHNOLOGY (HANGZHOU) LTD, Zhejiang (CN)

(72) Inventor: Shijie Chen, Zhejiang (CN)

(73) Assignee: SILERGY SEMICONDUCTOR TECHNOLOGY (HANGZHOU) LTD, Zhejiang (CN)

( * ) Notice: Subject to any disclaimer, the term of this patent is extended or adjusted under 35 U.S.C. 154(b) by 0 days.

(21) Appl. No.: 16/248,069

(22) Filed: Jan. 15, 2019

(65) Prior Publication Data
US 2019/0229043 A1     Jul. 25, 2019

(30) Foreign Application Priority Data

Jan. 24, 2018   (CN) .......................... 201810069713.1

(51) Int. Cl.
*H01L 23/495*     (2006.01)
*H01L 21/48*     (2006.01)
*H01L 23/31*     (2006.01)

(52) U.S. Cl.
CPC .... *H01L 23/49575* (2013.01); *H01L 21/4821* (2013.01); *H01L 23/3107* (2013.01); *H01L 23/49548* (2013.01); *H01L 23/49562* (2013.01); *H01L 23/49541* (2013.01); *H01L 2224/48091* (2013.01); *H01L 2224/48145* (2013.01); *H01L 2224/48247* (2013.01); *H01L 2924/181* (2013.01)

(58) Field of Classification Search
CPC .......... H01L 23/49575; H01L 23/3107; H01L 23/49541; H01L 24/49; H01L 21/56
See application file for complete search history.

(56) References Cited

U.S. PATENT DOCUMENTS

| 7,145,223 | B2 | 12/2006 | Kunimatsu et al. | |
| 8,338,234 | B2 * | 12/2012 | Iimura | H01L 21/481 257/673 |
| 9,136,231 | B2 | 9/2015 | Guo et al. | |

(Continued)

FOREIGN PATENT DOCUMENTS

| CN | 1461051 A | 12/2003 |
| CN | 201681864 U | 12/2010 |

(Continued)

OTHER PUBLICATIONS

CN201681864U english translation provided by Google Patents (Year: 2010).*

(Continued)

*Primary Examiner* — Zandra V Smith
*Assistant Examiner* — John M Parker
(74) *Attorney, Agent, or Firm* — Harness, Dickey & Pierce, P.L.C.

(57) ABSTRACT

A chip package assembly and a method for manufacturing the same are provided. A die is attached to one of pins located around a chip carrier, so that an electronic component such as a diode is packaged in the chip package assembly and is electrically connected in series with other dies inside the package, thereby improving the degree of integration of the chip package assembly, and reducing a volume of the external circuit.

9 Claims, 3 Drawing Sheets

(56) References Cited

U.S. PATENT DOCUMENTS

| | | | |
|---|---|---|---|
| 9,397,017 B2* | 7/2016 | Lin | H01L 23/142 |
| 2003/0003630 A1* | 1/2003 | Iimura | H01L 21/565 |
| | | | 438/127 |
| 2003/0218241 A1 | 11/2003 | Kunimatsu et al. | |
| 2004/0006869 A1* | 1/2004 | Igarashi | C25D 5/026 |
| | | | 29/847 |
| 2011/0221059 A1 | 9/2011 | Tang et al. | |
| 2013/0334686 A1 | 12/2013 | Guo et al. | |

FOREIGN PATENT DOCUMENTS

| | | |
|---|---|---|
| CN | 102074541 A | 5/2011 |
| CN | 204289446 U | 4/2015 |

OTHER PUBLICATIONS

First Chinese Office Action regarding Application No. 201810069713.1 dated May 24, 2019. Translation provided by Unitalen Attorneys at Law.

Fourth Chinese Office Action regarding Application No. 201810069713.1 dated Nov. 9, 2020. English translation provided by Unitalen Attorneys at Law.

* cited by examiner

CHIP PACKAGE ASSEMBLY AND METHOD FOR MANUFACTURING THE SAME

The present application claims priority to Chinese Patent Application No. 201810069713.1, titled "CHIP PACKAGE ASSEMBLY AND METHOD FOR MANUFACTURING THE SAME", filed on Jan. 24, 2018 with the Chinese Patent Office, which is incorporated herein by reference in its entirety.

FIELD

The present disclosure relates to the technical field of semiconductors, and in particular to a chip package assembly and a method for manufacturing the same.

BACKGROUND

A lead frame that is applied in the conventional Quad Flat No-lead (QFN) package, as shown in FIG. 1, includes a chip carrier 11 located at the center of the lead frame and multiple pins 12 surrounding the chip carrier 11. In the QFN package, multiple dies are generally packaged to improve the integration of the chip package assembly. However, packaged dies are stacked or distributed on the chip carrier which is located at the center of the lead frame. As shown in FIG. 2, a die 21 and a die 22 are stacked on the chip carrier 11. An electrode of the die 22 is electrically connected with the die 21 via a wire 221. Electrodes of the die 21 are connected with a pin 12 via wires 211. Alternatively, as shown in FIG. 3, the die 21 and the die 22 are distributed on the chip carrier 11, and electrodes of the die 21 and electrodes of the die 22 are connected with the pins 12 via the wires 211 and the wires 221 respectively.

In some application, however, an input terminal or an output terminal of a die is required to be connected in series with another die such as a diode, for driving an external circuit or protecting a terminal of an integrated circuit (IC). In such case, a control chip or a metal-oxide-semiconductor (MOS) field-effect transistor cannot be integrated with a diode into one package by using the QFN package shown in FIGS. 2 and 3. Instead, a separate diode is connected in series with an external circuit of a packaged die.

SUMMARY

In view of the above, a chip package assembly and a method for manufacturing the same are provided according to the present disclosure to integrate a diode with other dies in an encapsulator to realize a series connection of the diode and other dies inside the encapsulator.

A chip package assembly is provided, which includes: a lead frame, a first die and one or more second dies.

The lead frame has a chip carrier and multiple pins located around the chip carrier, where the chip carrier has a first surface and a second surface which are opposite to each other, and each of the multiple pins has a first surface and a second surface which or opposite to each other;

The first die is mounted on the first surface of the chip carrier.

The one or more second dies are mounted on first surfaces of the multiple pins.

In an embodiment, each of the second dies is mounted on the first surface of one of the multiple pins.

In an embodiment, each of the second dies includes a first electrode and a second electrode, the first electrode is electrically connected to a corresponding electrode of the first die, and the second electrode is connected to an external circuit via one of the multiple pins, so that the second die is connected with the first die in series.

In an embodiment, each of the second dies has a first surface and a second surface which are opposite to each other, the first electrode is arranged on the first surface, and the second electrode is arranged on the second surface. The second surface of the second die is electrically connected to the first surface of one of the multiple pins for mounting the second die by a conductive adhesive layer, to electrically connect the second electrode of the second die with the first surface of the pin. The first electrode of the second die is electrically connected with the corresponding electrode of the first die via a first wire, so that the second die is connected with the first die in series.

In an embodiment, each of the second dies has a first surface and a second surface which are opposite to each other, and the first electrode and the second electrode are arranged on the first surface. The first electrode of the second die is electrically connected to the corresponding electrode of the first die via a wire. The second electrode of the second die is electrically connected to the first surface of one of the multiple pins via a wire and is electrically connected to an external circuit through the pin, so that the second die is connected with the first die in series.

In an embodiment, each of the second dies includes a first electrode and a second electrode. The first electrode is electrically connected to a corresponding electrode of the first die, and the second electrode is connected to another corresponding electrode of the first die and is electrically connected to an external circuit via one of the multiple pins, so that the second die is connected with the first die in parallel.

In an embodiment, the first die has a first surface and a second surface, with the first surface of the first die being an active surface, the first die includes multiple electrodes arranged on the active surface. The second surface of the first die is attached to the first surface of the chip carrier, and the first electrode of one of the second dies is electrically connected with one of the electrodes on the active surface via a first wire, and remaining electrodes on the active surface are electrically connected, via second wires, with first surfaces of the pins other than pins for mounting the second dies.

In an embodiment, the second die is configured as a diode, the first electrode is one of an anode and a cathode of the diode, and the second electrode is the other of the anode and the cathode of the diode.

In an embodiment, the diode is a transient-voltage-suppression diode or a schottky diode.

In an embodiment, the chip package assembly further includes an encapsulator for encapsulating the first die and the second dies. The second surface of each of the multiple pins and the second surface of the chip carrier are exposed through a surface of the encapsulator.

In an embodiment, the chip package assembly is a DFN (Dual-Flat No-lead) package or a QFN (Quad-Flat No-lead) package.

A method for manufacturing a chip package assembly is provided, which includes: mounting a first die on a chip carrier of a lead frame; and mounting a second die on one of multiple pins of the lead frame, where the multiple pins are located around the chip carrier.

In an embodiment, before mounting the first die and the second die, the method further includes: forming the lead frame, with the pin for mounting the second die being configured to have a structure and a size for accommodating the second die.

In an embodiment, the second die is attached to the pin via a conductive adhesive layer.

In an embodiment, the method for manufacturing a chip package assembly further includes: electrically connecting an electrode of the second die to a corresponding electrode of the first die, and electrically connecting another electrode of the second die to the pin, so that the second die is connected with the first die in series.

In an embodiment, the method for manufacturing a chip package assembly further includes: electrically connecting an electrode of the second die to a corresponding electrode of the first die, and electrically connecting another electrode of the second die to another corresponding electrode of the first die and to the pin, so that the second die is connected with the first die in parallel.

In an embodiment, the method for manufacturing a chip package assembly further includes: encapsulating the first die and the second die by using a DFN (Dual-Flat No-lead) package or a QFN (Quad-Flat No-lead) package.

As can be seen, in the chip package according to the present disclosure, a die is mounted on a pin located around the chip carrier, so that an electronic component, such as a diode, is packaged in the chip package and is electrically connected in series with other dies inside the package, thereby improving the integration of the chip package assembly, and reducing a volume of an external circuit.

BRIEF DESCRIPTION OF THE DRAWINGS

Aforementioned and other objectives, characteristics and advantages of the present disclosure will become clearer from the following description of the embodiments thereof taken in conjunction with the drawings, where in the drawings.

DETAILED DESCRIPTION OF EMBODIMENTS

Figure 1:
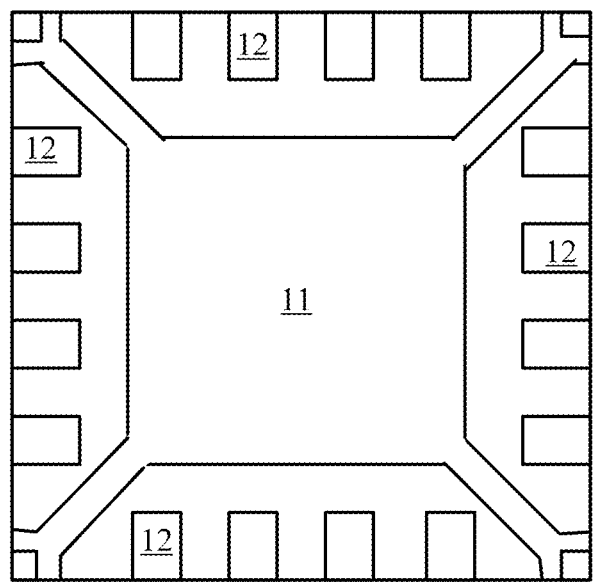
FIG. 1 is a schematic structural diagram of a lead frame in a QFN package assembly in the conventional technology.
Figure 2:
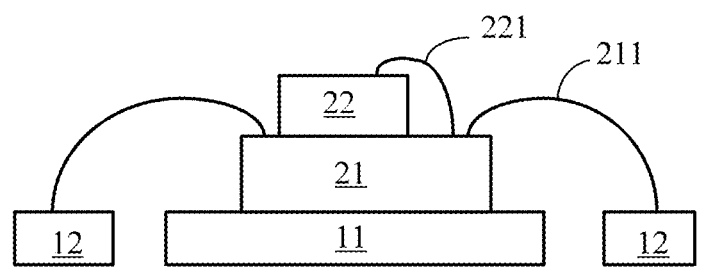
FIG. 2 is a schematic structural diagram of a QFN package assembly in which multiple dies are integrated in the conventional technology.
Figure 3:
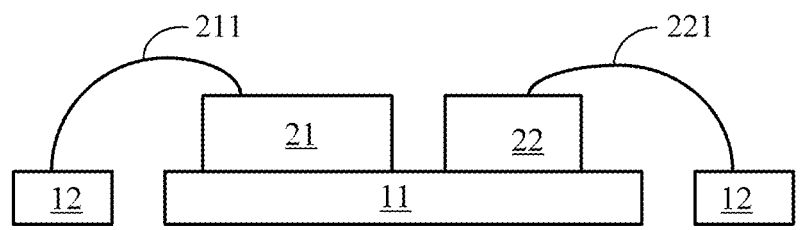
FIG. 3 is a schematic structural diagram of another QFN package assembly in which multiple dies are integrated in the conventional technology.

The present disclosure is described in detail with reference to the drawings hereinafter. In the drawings, identical components are denoted with the similar reference numerals. Parts of the drawings are not necessarily drawn to scale for clarity. Furthermore, some well known parts are not illustrated. For simplicity, a semiconductor structure acquired after several steps may be shown in one figure. Some specific details of the present disclosure are described, such as a structure, a material, a dimension, a process and a technology of each component, for a better understanding of the present disclosure. But as will be appreciated by those skilled in the art, the present disclosure may be practiced without these specific details.

Figure 4:
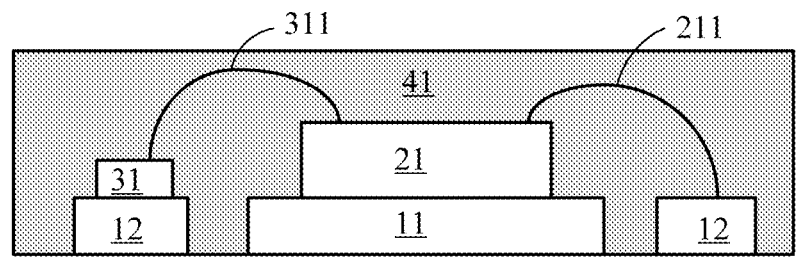
FIG. 4 is a cross sectional view of a chip package assembly according to an embodiment of the present disclosure.
Figure 5:
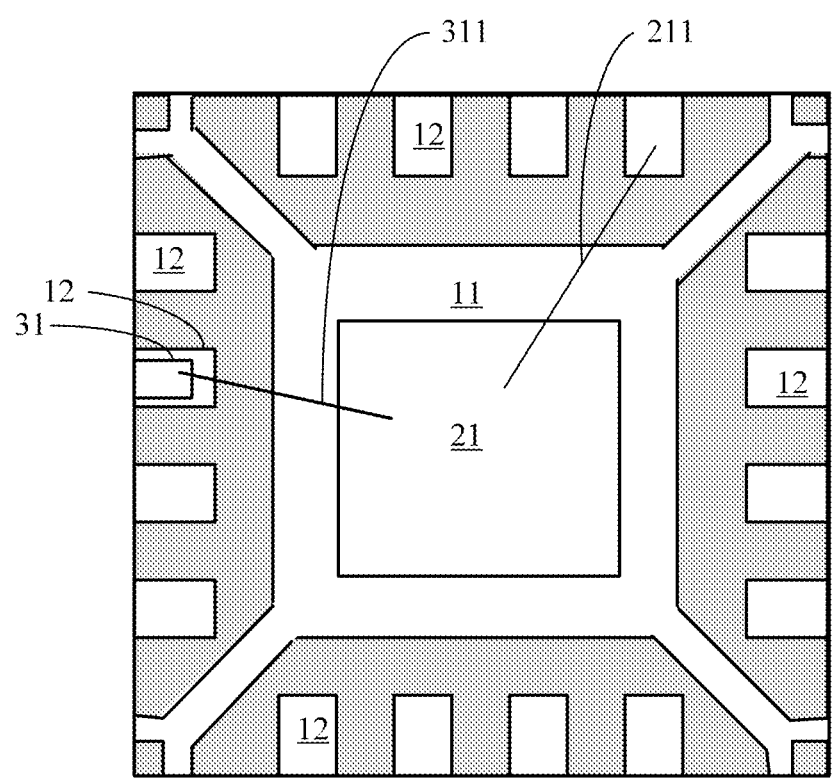
FIG. 5 is a top view of a chip package assembly according to an embodiment of the present disclosure.

FIG. 4 is a cross sectional view of a chip package assembly according to an embodiment of the present disclosure. FIG. 5 is a top view of a chip package assembly according to an embodiment of the present disclosure. The present disclosure is described in detail with reference to FIGS. 4 and 5.

The chip package assembly according to the present disclosure includes a lead frame, one or more first dies, one or more second dies. The lead frame includes a chip carrier 11 and multiple pins 12 located around the chip carrier 11. The chip carrier 11 has a first surface and a second surface which are opposite to each other, and each of the multiple pins 12 has a first surface and a second surface which or opposite to each other. Multiple pins 12 may be symmetrically arranged on four sides of the chip carrier 11 or symmetrically arranged on two opposite sides of the chip carrier 11.

The first die 21 is mounted on the chip carrier, and has a first surface and a second surface which are opposite to each other. The first surface of the first die 21 is an active surface. The second surface of the first die 21 is attached to the first surface of the chip carrier 11. The second dies 31 are mounted on the pins 12. Specifically, each of the second dies 31 is located on one of the multiple pins 12. The pin 12 is configured to lead out an electrode of the second die 31, so that the electrode is electrically connected with other external devices or circuits. Further, the pin 12 is also configured to carry the second die 31, that is, the pin 12 is configured to provide a mechanical support for the second die 31.

The first electrode of the second die 31 is electrically connected with the corresponding electrode on the active surface of the first die 21 via a wire 311. The remaining electrodes on the active surface of the first die 21 are electrically connected, via wires 211, with first surfaces of pins 12 other than the pin 12 for carrying the second die 31. In the chip package assembly, the second die 31 is connected in series with the first die 21.

In an embodiment, each of the second dies 31 has a first surface and a second surface which are opposite to each other, and includes a first electrode arranged on the first surface and a second electrode arranged on the second surface. The first electrode is electrically connected to a corresponding electrode on the active surface of the first die, and the second electrode is connected to an external circuit via one of the multiple pins, to connect the first die with the second die in series.

Specifically, the second die 31 is attached to the pin 12 with the second surface of the second die 31 facing toward the first surface of the pin 12. The second electrode is electrically connected with the first surface of the pin 12 by a conductive adhesive layer.

In an alternative embodiment, the second die 31 has a first surface and a second surface which are opposite to each other, and the first electrode and the second electrode are arranged on the first surface. The first electrode of the second die 31 is electrically connected to the corresponding electrode on the active surface of the first die 21 via a wire. The second electrode of the second die 31 is electrically connected to the first surface of the pin 12 via a wire and is electrically connected to an external circuit through the pin, so that the second die is connected with the first die in series.

In an alternative embodiment, each of the second dies 31 includes a first electrode and a second electrode, the first electrode is electrically connected to a corresponding electrode of the first die 21, and the second electrode is connected to another corresponding electrode of the first die 21 and is electrically connected to the external circuit through the pin 12, so that the second die 31 is connected with the first die 21 in parallel.

In the chip package assembly according to the embodiment of the present disclosure, the second die 31 is a diode, the first electrode is one of an anode and a cathode of the diode, and the second electrode is the other of the anode and the cathode of the diode. The second die 31 may specifically be a TVS (Transient Voltage Suppression) diode or a Schottky diode. The first die 21 may be a metal-oxide-semiconductor field-effect transistor (MOSFET), such as a power MOSFET, or a control chip.

Moreover, the chip package assembly further includes an encapsulator 41 for encapsulating the first die 21 and the second die 31. The second surface of the pin 12 and the second surface of the chip carrier are exposed through a surface of the encapsulator 41 to serve as external pins for electrically connecting the chip package assembly with an external circuit.

The chip package assembly may be a DFN package assembly or a QFN package assembly, depending on the arrangement of the pins 12 around the chip carrier 11. The chip package assembly may further include a third die (not shown in FIGS. 4 and 5). The third die is stacked on the first die 21, or the third die and the first die 21 are distributed on the chip carrier 11. In a case that the third die is stacked on the first die 21, an electrode of the third die is first electrically connected with the first surface of the first die 21 via a wire, and then is led from the first surface of the first die 21 to the pin 12 via a wire. In a case that the third die and the first die 21 are distributed on the chip carrier 11, an electrode of the third die is directly connected with the pin 12 via a wire. The chip package assembly may include multiple second dies, where each of the second dies is mounted on one of the pins.

In addition, a method for manufacturing the chip package assembly is further provided according the present disclosure, which includes following steps. A first die is mounted on a chip carrier of a lead frame. A second die is mounted on one of multiple pins of the lead frame, where the multiple pins are located around the chip carrier.

The method further includes fabricating the lead frame, with each of the multiple pins is configured to have a structure and a size for accommodating the second die, so that the pin matches the second die.

In an embodiment, the method further includes electrically connecting an electrode of the second die to a corresponding electrode of the first die, and electrically connecting another electrode of the second die to the pin, so that the second die is connected with the first die in series.

In an embodiment, the method further includes electrically connecting an electrode of the second die to a corresponding electrode of the first die, and electrically connecting another electrode of the second die to another corresponding electrode of the first die and to the pin, so that the second die is connected with the first die in parallel.

The first die and the second die may be packaged by using a DFN package, a QFN package and other packages including lead frames.

Specifically, the second die is attached to the pin via a conductive layer, such as a conductive adhesive layer, so that the pin functions as not only a contact pad by which the second die is electrically connected with external circuits or a devices, but also a mechanical support for carrying the second die.

As can be seen, in the chip package assembly and the method for manufacturing the chip package assembly provided in the present disclosure, a die is mounted on one of the pins located around the chip carrier, so that the devices such as diodes are packaged in the chip package assembly and are electrically connected in series with other dies inside the package, such that the integration of the chip package assembly is improved, and a volume of the external circuit is reduced.

The embodiments of the present disclosure, as illustrated above, do not provide all details and are not intend to limit the present disclosure. Obviously, many modifications and variations are possible based on the above description. Those embodiments were chosen and described herein to better illustrate the principles of the present disclosure and practical application thereof, so that those skilled in the art can better utilize and make modification based on the present disclosure. Therefore, the present disclosure is to be limited by only claims and equivalents thereof.

The invention claimed is:

1. A chip package assembly, comprising:
   a lead frame, having a chip carrier and a plurality of pins located around the chip carrier, wherein the chip carrier has a first surface and a second surface which are opposite to each other, and each of the plurality of pins has a first surface and a second surface which or opposite to each other;
   a first die, mounted on the first surface of the chip carrier; and
   one or more second dies, mounted on first surfaces of the plurality of pins, wherein
   each of the second dies comprises a first electrode and a second electrode, the first electrode is electrically connected to a corresponding electrode of the first die, and the second electrode is connected to an external circuit via one of the plurality of pins, so that the second die is connected with the first die in series, or
   each of the second dies comprises a first electrode and a second electrode, the first electrode is electrically connected to a corresponding electrode of the first die, and the second electrode is connected to another corresponding electrode of the first die and is electrically connected to an external circuit via one of the plurality of pins, so that the second die is connected with the first die in parallel.

2. The chip package assembly according to claim 1, wherein each of the second dies is mounted on the first surface of one of the plurality of pins.

3. The chip package assembly according to claim 1, wherein in a case that the second die is connected with the first die in series,
   each of the second dies has a first surface and a second surface which are opposite to each other, the first electrode is arranged on the first surface, and the second electrode is arranged on the second surface,
   the second surface of the second die is electrically connected to the first surface of one of the plurality of pins for mounting the second die by a conductive adhesive layer, to electrically connect the second electrode of the second die with the first surface of the pin, and
   the first electrode of the second die is electrically connected with the corresponding electrode of the first die via a first wire, so that the second die is connected with the first die in series.

4. The chip package assembly according to claim 1, wherein in a case that the second die is connected with the first die in series, each of the second dies has a first surface and a second surface which are opposite to each other, and the first electrode and the second electrode are arranged on the first surface, the first electrode of the second die is electrically connected to the corresponding electrode of the first die via a wire, the second electrode of the second die is electrically connected to the first surface of one of the plurality of pins via a wire and is electrically connected to an external circuit through the pin, so that the second die is connected with the first die in series.

5. The chip package assembly according to claim 1, wherein in a case that the second die is connected with the first die in series, the first die has a first surface and a second surface, with the first surface of the first die being an active surface, the first die comprises a plurality of electrodes arranged on the active surface, the second surface of the first die is attached to the first surface of the chip carrier, and the first electrode of one of the second dies is electrically connected with one of the electrodes on the active surface via a first wire, and remaining electrodes on the active surface are electrically connected, via second wires, with first surfaces of the pins other than pins for mounting the second dies.

6. The chip package assembly according to claim 1, wherein the second die is configured as a diode, the first electrode is one of an anode and a cathode of the diode, and the second electrode is the other of the anode and the cathode of the diode.

7. The chip package assembly according to claim 6, wherein the diode is a transient-voltage-suppression diode or a schottky diode.

8. The chip package assembly according to claim 1, further comprising:

an encapsulator, for encapsulating the first die and the second dies, wherein the second surface of each of the plurality of pins and the second surface of the chip carrier are exposed through a surface of the encapsulator.

9. The chip package assembly according to claim 1, wherein the chip package assembly is a DFN (Dual-Flat No-lead) package or a QFN (Quad-Flat No-lead) package.

* * * * *